(12) United States Patent
An et al.

(10) Patent No.: US 11,267,828 B2
(45) Date of Patent: Mar. 8, 2022

(54) SILICON PRECURSOR AND METHOD OF MANUFACTURING SILICON-CONTAINING THIN FILM USING THE SAME

(71) Applicant: HANSOL CHEMICAL CO., LTD., Seoul (KR)

(72) Inventors: Jae-Seok An, Jeollabuk-do (KR); Jong-Ryul Park, Incheon (KR); Min-Hyuk Nim, Yongin-si (KR); Jang-Hyeon Seok, Sejong-si (KR); Jung Woo Park, Seoul (KR)

(73) Assignee: Hansol Chemical Co., Ltd., Seoul (KR)

( * ) Notice: Subject to any disclaimer, the term of this patent is extended or adjusted under 35 U.S.C. 154(b) by 0 days.

(21) Appl. No.: 16/497,973

(22) PCT Filed: Apr. 24, 2019

(86) PCT No.: PCT/KR2019/004960
§ 371 (c)(1),
(2) Date: Sep. 26, 2019

(87) PCT Pub. No.: WO2020/111405
PCT Pub. Date: Jun. 4, 2020

(65) Prior Publication Data
US 2021/0277031 A1    Sep. 9, 2021

(30) Foreign Application Priority Data

Nov. 30, 2018  (KR) .................... 10-2018-0152678
Jan. 30, 2019  (KR) .................... 10-2019-0011855

(51) Int. Cl.
*H01L 21/02* (2006.01)
*C23C 16/40* (2006.01)
(Continued)

(52) U.S. Cl.
CPC .............. *C07F 7/10* (2013.01); *C23C 16/402* (2013.01); *C23C 16/45553* (2013.01);
(Continued)

(58) Field of Classification Search
None
See application file for complete search history.

(56) References Cited

U.S. PATENT DOCUMENTS 5,593,741 A    1/1997 Ikeda
2005/0042888 A1    2/2005 Roeder et al.
(Continued)

FOREIGN PATENT DOCUMENTS

CN    103058696 A    4/2013
CN    103374708 A    10/2013
(Continued)

OTHER PUBLICATIONS

Partial Supplementary Search Report issued in European Application No. 19769976.2, dated Mar. 16, 2020.

*Primary Examiner* — Asok K Sarkar
(74) *Attorney, Agent, or Firm* — BakerHostetler

(57) ABSTRACT

The present invention relates to a vapor deposition compound capable of thin film deposition through vapor deposition, and particularly to a silicon precursor capable of being applied to ALD or CVD, and specifically, enabling high temperature deposition, and a method of manufacturing a silicon-containing thin film.

4 Claims, 14 Drawing Sheets

(51) Int. Cl.
  *C07F 7/10* (2006.01)
  *C23C 16/455* (2006.01)
(52) U.S. Cl.
  CPC .... *H01L 21/0228* (2013.01); *H01L 21/02164* (2013.01); *H01L 21/02208* (2013.01); *H01L 21/02271* (2013.01)

(56) References Cited

U.S. PATENT DOCUMENTS

| | | | |
|---|---|---|---|
| 2009/0085170 | A1 | 4/2009 | Imada et al. |
| 2013/0295779 | A1 | 11/2013 | Chandra et al. |
| 2014/0273528 | A1 | 9/2014 | Niskanen et al. |
| 2015/0275355 | A1 | 10/2015 | Mallikarjunan et al. |
| 2018/0033614 | A1* | 2/2018 | Chandra ........... H01L 21/02208 |

FOREIGN PATENT DOCUMENTS

| | | |
|---|---|---|
| CN | 104911561 A | 9/2015 |
| CN | 108118309 A | 6/2018 |
| CN | 108411279 A | 8/2018 |
| JP | 2008042208 A | 2/2008 |
| JP | 2013236073 A | 11/2013 |
| JP | 2015146416 A | 8/2015 |
| JP | 2016096247 A | 5/2016 |
| KR | 2001-0098415 A | 11/2001 |
| KR | 2011-0017404 A | 2/2011 |
| KR | 2013-0034001 A | 4/2013 |
| KR | 2014-0067786 A | 6/2014 |
| KR | 2016-0093093 A | 8/2016 |
| KR | 2016-0100260 A | 8/2016 |
| TW | 201536946 A | 10/2015 |
| TW | 201708593 A | 3/2017 |
| TW | 201718606 A | 6/2017 |

* cited by examiner

| (a) PROCESS TEMPERATURE: 600°C SURFACE ROUGHNESS: 0.117nm | (b) PROCESS TEMPERATURE: 750°C SURFACE ROUGHNESS: 0.159nm | (c) PROCESS TEMPERATURE: 800°C SURFACE ROUGHNESS: 0.197nm |

SILICON PRECURSOR AND METHOD OF MANUFACTURING SILICON-CONTAINING THIN FILM USING THE SAME

CROSS-REFERENCE TO RELATED APPLICATIONS

This application is a National Stage of International patent application PCT/KR2019/004960, filed on Apr. 24, 2019, which claims priority to foreign Korean patent application No. KR 10-2018-0152678, filed on Nov. 30, 2018, and Korean patent application No. 10-2019-0011855, filed on Jan. 30, 2019, the disclosures of which are incorporated by reference in their entireties.

FIELD OF THE INVENTION

The present invention relates to a vapor deposition compound enabling thin film deposition through vapor deposition, and more particularly, to a novel silicon precursor and a method of manufacturing a silicon-containing thin film using the same, which is able to be applied to atomic layer deposition (ALD) or chemical vapor deposition (CVD), and particularly, to be used in manufacturing a thin film with an excellent quality at a high process temperature.

BACKGROUND

A silicon-containing thin film is used as a microelectronic element such as a RAM (memory and logic chip), a flat panel display such as a thin film transistor (TFT), and a semiconductor substrate, a diffusion mask, a passivation layer or a dielectric layer in semiconductor technology such as the field of solar energy.

Particularly, a silicon-containing thin film having various types of performance according to the high integration of a semiconductor device is required, and since an aspect ratio increases due to the high integration of a semiconductor device, there is a problem in that required performance cannot be achieved by the deposition of a silicon-containing thin film using a conventional precursor.

According to the deposition of a thin film using a conventional precursor, it is difficult for a highly-integrated semiconductor device to have excellent step coverage and for a thickness to be controlled, and there is a problem of impurities being contained in the thin film.

Therefore, for deposition of a high-quality silicon-containing thin film, various silicon precursors including an aminosilane as well as conventional silicon precursors such as a silane, a disilane, a halogenated silane, etc. have been studied and developed.

Generally, as aminosilane precursors, butylaminosilane (BAS), bis(tertiary butylamino)silane (BTBAS), dimethylaminosilane (DMAS), bis(dimethyl amino)silane (BDMAS), tris(dimethylamino)silane (3-DMAS), diethylaminosilane (DEAS), bis(diethylamino)silane (BDEAS), dipropylaminosilane (DPAS) and di(isopropylamino)silane (DIPAS) are widely used.

In the manufacture of a silicon-containing thin film, atomic layer deposition (ALD) or chemical vapor deposition (CVD) is widely used.

Among these methods, particularly, when ALD is applied to form a silicon-containing thin film, the thickness uniformity and physical property of a thin film can be improved, thereby improving the characteristics of a semiconductor device, and therefore, ALD application is highly increased in recent years. However, since CVD and ALD have different reaction mechanisms, a precursor suitable for CVD may not produce a thin film with a desired quality with ALD, and thus research and development of precursors applicable to the combination of CVD and ALD are increasing.

Meanwhile, while there is a patent in which one aminosilane precursor, for example, 3-DMAS, is utilized as a precursor, as disclosed in U.S. Pat. No. 5,593,741, a high-quality thin film was not able to be obtained at a high process temperature even by using 3-DMAS as a precursor. In addition, even when a halogen element-substituted silicon precursor is used, although there was an effect in low temperature deposition, a high-quality thin film was still not obtained at a high process temperature.

PRIOR ART DOCUMENTS

Patent Documents (Patent Document 1) Korean Unexamined Patent Application Publication No. 2011-0017404
(Patent Document 2) U.S. Pat. No. 5,593,741

SUMMARY OF THE INVENTION

Therefore, the present invention is directed to providing a novel silicon compound, which is able to be applied to the combination of ALD and CVD.

Particularly, the present invention is directed to providing a silicon precursor and a method of manufacturing a silicon-containing thin film using the same, which is able to ensure an ALD behavior at a high temperature since the silicon compound can be applied to a high process temperature of 600° C. or more, has a low impurity concentration in a silicon oxide film (particularly, impurities such as Cl, H, C, N, etc. are not detected), and has excellent corrosion resistance as well as an excellent interface characteristic since excellent step coverage and surface characteristics (a crystal characteristic and roughness) can be ensured.

However, technical problems to be solved in the present invention are not limited to the above-described problems, and other problems which are not described herein will be fully understood by those of ordinary skill in the art from the following descriptions.

In one aspect, the present invention provides a method of manufacturing a thin film, which includes introducing a vapor deposition precursor including any one or more compounds selected from the group consisting of a compound represented by Formula 1 and a compound represented by Formula 2 into a chamber:

$\text{SiR}^1_a(\text{NR}^2\text{R}^3)_{(4-a)}$ [Formula 1]

In Formula 1, a is an integer of 1 to 3, $R^1$ is a substituted or unsubstituted C1 to C4 hydrocarbon, and more particularly, a linear or branched, saturated or unsaturated alkyl group or an isomer thereof, and $R^2$ and $R^3$ are each independently hydrogen or a substituted or unsubstituted C1 to C4 hydrocarbon, and more particularly, a linear or branched, saturated or unsaturated alkyl group or an isomer thereof.

$\text{SiR}^4_b\text{R}^5_c(\text{X}^1)_{(4-b-c)}$ [Formula 2]

In Formula 2, each of b and c is an integer of 0 to 3, the sum of b and c is an integer of 1 to 3, $X^1$ is a halogen group selected from the group consisting of Cl, Br, and I, and $R^4$ and $R^5$ are each independently a substituted or unsubstituted C1 to C4 hydrocarbon, and more specifically, a linear or branched, saturated or unsaturated alkyl group, an unsubstituted C6 to C12 cyclic hydrocarbon or an isomer thereof.

In another aspect, in the method of manufacturing a thin film, $R^1$ is any one selected from the group consisting of a methyl group, an ethyl group, a n-propyl group, an iso-propyl group, a n-butyl group, an iso-butyl group, a sec-butyl group, a tert-butyl group and an isomer thereof, $R^2$ and $R^3$ are each independently any one selected from the group consisting of hydrogen, a methyl group, an ethyl group, a n-propyl group, an iso-propyl group, a n-butyl group, an iso-butyl group, a sec-butyl group, a tert-butyl group and an isomer thereof, and $R^4$ and $R^5$ are each independently any one selected from the group consisting of a methyl group, an ethyl group, a n-propyl group, an iso-propyl group, a n-butyl group, an iso-butyl group, a sec-butyl group, a tert-butyl group, an unsubstituted phenyl group, an unsubstituted benzyl group, an unsubstituted xylene group and an isomer thereof.

In still another aspect, in the method of manufacturing a thin film, any one or more selected from the group consisting of a vapor deposition precursor represented by Formula 1, in which a is 1, and $R^1$, $R^2$ and $R^3$ are methyl groups, and vapor deposition precursors represented by Formulas 2-1 to 2-4 are included.

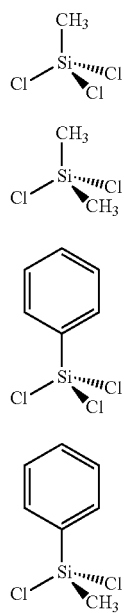

[Formula 2-1]

[Formula 2-2]

[Formula 2-3]

[Formula 2-4]

In yet another aspect, the method of manufacturing a thin film is performed by ALD or CVD.

In yet another aspect, the method of manufacturing a thin film further includes injecting any one or more selected from the group consisting of oxygen ($O_2$), water ($H_2O$), ozone ($O_3$), a mixture of $O_2$ and hydrogen ($H_2$), nitrogen ($N_2$), ammonia ($NH_3$), nitrous oxide ($N_2O$), and hydrogen peroxide ($H_2O_2$) as a reactive gas.

In yet another aspect, the method of manufacturing a thin film further includes performing deposition at a process temperature of 600° C. or more.

The thin film manufactured by the manufacturing method of the present invention has a surface roughness of 0.3 nm or less, and a density of 2.1 g/cm³ or more.

In yet another aspect, the present invention provides an electronic device including the thin film manufactured in the present invention, and the electronic device is any one selected from the group consisting of a semiconductor, a display and a solar cell.

A novel silicon precursor according to the present invention cannot be thermally decomposed at a high temperature of 600° C. or more, and particularly, can be applied to high temperature ALD, precisely control a thickness due to a low thin film growth rate and a uniform deposition rate, and have excellent step coverage.

In addition, a high-quality silicon-containing thin film can be manufactured through the deposition of the novel silicon precursor according to the present invention.

Due to the above-described excellent characteristics, the future application of a 3D-NAND memory device as a tunneling oxide film is expected, and the high-quality silicon thin film can be applied to various fields such as the manufacture of a nano device and a nano structure, a semiconductor, a display, a solar cell, etc. Moreover, it also can be used as an insulating film of a non-memory semiconductor.

Such physical properties provide precursors suitable for ALD and CVD, and can be expected to be applied as a dielectric material of a semiconductor device according to a method of manufacturing a thin film in which the precursor is deposited.

DETAILED DESCRIPTION

Figure 1:
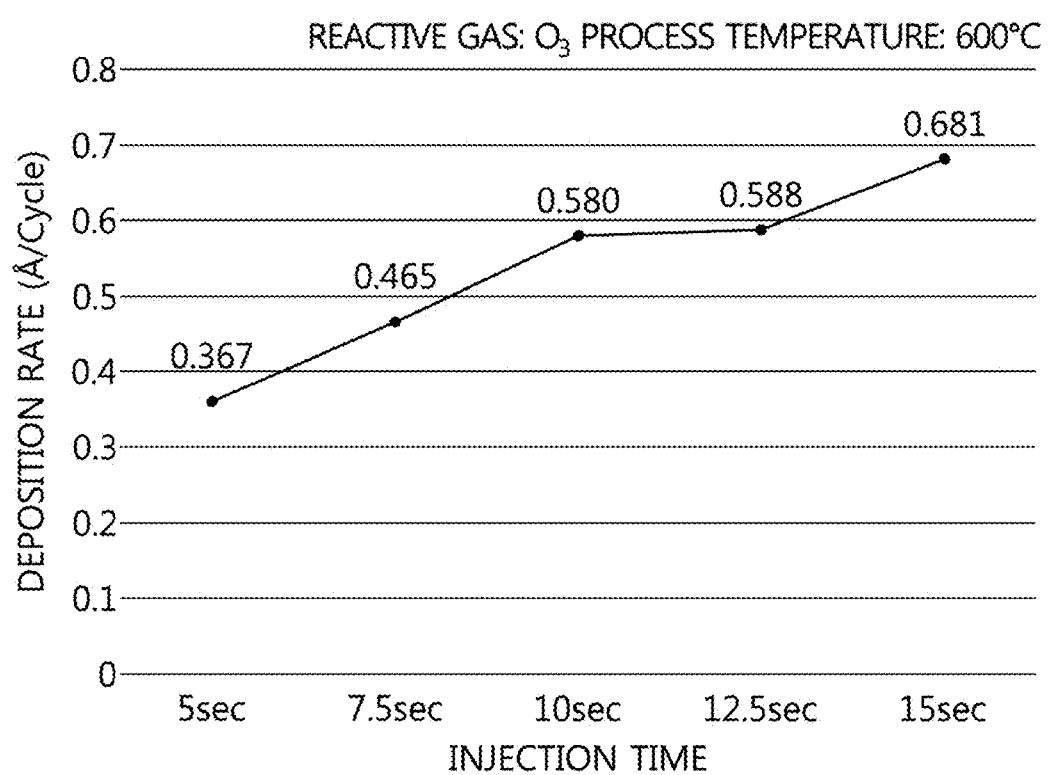
FIG. 1 is a graph of a deposition rate according to the injection time of a precursor when deposition was performed using a precursor of Example 1 and $O_3$ as a reactant (reactive gas) at a process temperature of 600° C. (Manufacturing Examples 1-1 to 1-5).

Hereinafter, embodiments of the present invention will be described in detail with reference to the accompanying drawings so that those of ordinary skill in the art can easily carry out the present invention. However, the present invention may be implemented in a variety of different forms, and is not limited to the embodiments described herein. In addition, for clear explanation of the present invention in the drawings, parts that are not related to the description are omitted.

In one aspect, the present invention provides a method of manufacturing a thin film, which includes introducing a vapor deposition precursor including any one or more compounds selected from the group consisting of compounds represented by Formulas 1 and 2 below into a chamber:

$$SiR^1_a(NR^2R^3)_{(4-a)} \quad \text{[Formula 1]}$$

In Formula 1,
a is an integer of 1 to 3,
$R^1$ is a substituted or unsubstituted C1 to C4 hydrocarbon, and more particularly, a linear or branched, saturated or unsaturated C1 to C4 alkyl group or an isomer thereof, and $R^2$ and $R^3$ are each independently hydrogen or a substituted or unsubstituted C1 to C4 hydrocarbon, and more particularly, a linear or branched, saturated or unsaturated alkyl group or an isomer thereof.

$$SiR^4_b R^5_c (X^1)_{(4-b-c)} \quad \text{[Formula 2]}$$

In Formula 2,
each of b and c is an integer of 0 to 3,
the sum of b and c is an integer of 1 to 3,
$X^1$ is a halogen group selected from the group consisting of Cl, Br, and I,
$R^4$ and $R^5$ are each independently a substituted or unsubstituted C1 to C4 hydrocarbon, more specifically, a linear or branched, saturated or unsaturated alkyl group, an unsubstituted C6 to C12 cyclic hydrocarbon, or an isomer thereof.

Preferably, in Formula 1, $R^1$ is any one selected from the group consisting of a methyl group, an ethyl group, a n-propyl group, an iso-propyl group, an n-butyl group, an iso-butyl group, a sec-butyl group, a tert-butyl group and an isomer thereof, and $R^2$ and $R^3$ are each independently any one selected from the group consisting of hydrogen, a methyl group, an ethyl group, an n-propyl group, an iso-propyl group, an n-butyl group, an iso-butyl group, a sec-butyl group, a tert-butyl group and an isomer thereof.

More preferably, in Formula 1, a is 1, and each of $R^1$, $R^2$ and $R^3$ is a methyl group, but the present invention is not limited thereto.

Preferably, in Formula 2, $R^4$ and $R^5$ are each independently any one selected from the group consisting of a methyl group, an ethyl group, an n-propyl group, an iso-propyl group, an n-butyl group, an iso-butyl group, a sec-butyl group, a tert-butyl group, an unsubstituted phenyl group, an unsubstituted benzyl group, an unsubstituted xylene group and an isomer thereof.

More preferably, the compound represented by Formula 2 is a compound represented by each of Formulas 2-1 to 2-4, but the present invention is not limited thereto.

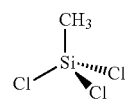

[Formula 2-1]

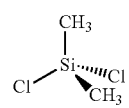

[Formula 2-2]

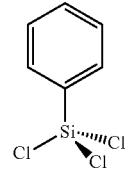

[Formula 2-3]

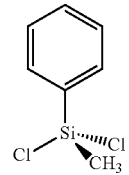

[Formula 2-4]

Characteristics of the compounds of Formulas 2-1 to 2-4 are shown in Table 1 below.

TABLE 1

| Structural formula | 2-1 | 2-2 | 2-3 | 2-4 |
|---|---|---|---|---|
| Molecular weight | 149.48 | 129.06 | 211.55 | 191.13 |
| Boiling point | 66° C. | 70° C. | 201° C. | 205° C. |

TABLE 1-continued

| Structural formula | 2-1 | 2-2 | 2-3 | 2-4 |
|---|---|---|---|---|
| Vapor pressure | 167 mmHg @ 25° C. | 100 mmHg @ 17.5° C. | 0.426 mmHg @ 25° C. | 0.49 mmHg @ 25° C. |
| State at room temperature | Colorless liquid | Colorless liquid | Colorless liquid | Colorless liquid |
| Decomposition temperature | 800~1400° C. | ~1000° C. | >250; 530° C. ($N_2$) | |

In another aspect, the present invention provides a method of manufacturing a thin film, which includes introducing a vapor deposition precursor including the compound represented by Formula 1 and the compound represented by Formula 2 in a ratio of d:e into a chamber. Each of d and e is a real number of 0 to 1, and the sum of d and e is a real number of 1 to 2. Preferably, both d and e may exceed 0, and thus high temperature stability, thin film thickness controllability and step coverage may be improved.

The introduction of a vapor deposition precursor may include physical adsorption, chemical adsorption or physiochemical adsorption, but the present invention is not limited thereto.

In one exemplary embodiment of the present invention, vapor deposition may include ALD or CVD, and the chemical vapor deposition may include metal organic chemical vapor deposition (MOCVD) and low-pressure chemical vapor deposition (LPCVD), but the present invention is not limited thereto.

In one exemplary embodiment of the present invention, the method of manufacturing a thin film may further include injecting any one or more selected from the group consisting of oxygen ($O_2$), water ($H_2O$), ozone ($O_3$), a mixture of $H_2$ and $O_2$ ($H_2+O_2$), nitrogen ($N_2$), nitrous oxide ($N_2O$), ammonia ($NH_3$), and hydrogen peroxide ($H_2O_2$) as reactive gases. In addition, various oxygen-containing reactants, nitrogen-containing reactants and carbon-containing reactants may be used together depending on a required characteristic of the thin film, but the present invention is not limited thereto.

In one exemplary embodiment of the present invention, the method of manufacturing a thin film may be performed at a high temperature, and the deposition may be performed preferably at a process temperature of 300 to 1100° C., more preferably at a process temperature of 500 to 900° C., and even more preferably a process temperature of 600 to 800° C.

It is difficult for conventional silicon precursors to control a thickness at a high temperature process temperature of 600° C. or more and a high-quality thin film having a desired characteristic cannot be provided. However, the novel high temperature silicon precursor is thermally stable even at 600° C. or more, and thus can provide a high-quality thin film even by a high temperature process.

Still another aspect of the present invention provides a high purity amorphous silicon oxide film manufactured by the method of manufacturing a thin film, which has a surface roughness of 0.3 nm or less, and preferably 0.2 nm or less, and a density of 2.1 g/cm³ or more, preferably 2.15 g/cm³ or more, and more preferably, 2.2 g/cm³ or more. Various thin films such as an oxide film, a nitride film, a carbide film, a carbonitride film and an oxynitride film may be provided according to a selected reactant. In addition, it is expected to have an excellent interface characteristic and an excellent corrosion resistance due to the surface characteristic and density of the thin film.

Yet another aspect of the present invention provides a multi-layered thin film, which includes the thin film manufactured according to the present invention.

Yet another aspect of the present invention provides an electronic device, which includes the thin film manufactured according to the present invention. The electronic device may be any one selected from the group consisting of a semiconductor, a display and a solar cell, and particularly, excellent characteristics may be realized as a tunneling oxide film of a 3D-NAND memory device.

Hereinafter, the present invention will be described in further detail with reference to examples, but the present invention is not limited thereto.

[Example 1] Preparation of methyl tris(dimethylamino)silane ($Si(CH_3)(N(CH_3)_2)_3$)

150 g of $MeSiCl_3$ and 7 L of hexane were dissolved in a flask, and then decreased in temperature using acetone and dry ice. While the low temperature was maintained, 360 g of dimethylamine gas was added to the solution. After the addition was completed, the mixture was stirred at room temperature for 20 hours. After the reaction was completed, a solution obtained by filtration through a filter was boiled under atmospheric pressure to remove the solvent, thereby obtaining a colorless, transparent liquid. The liquid obtained thereby was purified under reduced pressure, thereby obtaining 123 g of a colorless, transparent liquid (yield: 70%).

The structure of the obtained $Si(CH_3)(N(CH_3)_2)_3$ is shown by the following chemical structural formula, and the chemical structure was verified by $^1$H-NMR as follows.

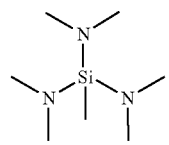

[Chemical Structure of Compound of Example 1]
$^1$H-NMR (C6D6):
δ 2.46 (($CH_3$)Si(N($C\underline{H}_3$)$_2$)$_3$, s, 18H);
δ 0.13 (($C\underline{H}_3$)Si(N($CH_3$)$_2$)$_3$, s, 3H)

In addition, the molecular weight of the obtained compound was 161.32 g/mol, the state at room temperature was a colorless liquid, and the boiling point was 142° C. The compound is able to facilitate the input into a process chamber under a high vapor pressure, and it is possible to sufficiently supply the precursor in a short period of time.

Manufacturing Example 1

A silicon oxide film was manufactured by depositing the compound prepared in Example 1 using an ALD apparatus. A substrate used in this experiment was a bare Si wafer, and before deposition, the bare Si wafer was subjected to 10-minute ultrasonication in acetone-ethanol-deionized water (DI water), and then immersed in a 10% HF solution (HF:$H_2O$=1:9) for 10 seconds to remove a natural oxide film thereon.

[Injection of silicon precursor of Example 1](X sec)-[Purging of precursor (argon, Ar)](7 sec)-[Reactive gas (ozone, $O_3$)](5 sec)-[Purging with reactive gas (Ar)](7 sec) were sequentially performed for deposition, and the above-described processes were set as one cycle.

In the supply of the silicon precursor of Example 1 (X sec), X was 5 to 15 seconds, the precursor delivery gas, argon, was injected at 500 sccm, and deposition was performed in a process temperature range of 600 to 800° C.

Temperatures of all canisters were room temperature, and Ar for purging was injected at 1500 sccm.

Table 2 below shows process conditions and deposition results (thickness and deposition rate) of Manufacturing Example 1 using the precursor compound of Example 1 and a reactive gas ($O_3$).

TABLE 2

| Manufacturing Example | Reactive gas | Precursor injection time (sec) | Precursor purge time (sec) | Reactive gas injection time (sec) | Reactive gas purge time (sec) | Process temperature (° C.) | Cycle | Thickness (A) | Deposition rate (A/cycle) |
|---|---|---|---|---|---|---|---|---|---|
| 1-1 | $O_3$ | 5 | 7 | 5 | 7 | 600 | 100 | 36.77 | 0.367 |
| 1-2 | $O_3$ | 7.5 | 7 | 5 | 7 | 600 | 100 | 46.56 | 0.465 |
| 1-3 | $O_3$ | 10 | 7 | 5 | 7 | 600 | 100 | 58.01 | 0.580 |
| 1-4 | $O_3$ | 12.5 | 7 | 5 | 7 | 600 | 100 | 58.84 | 0.588 |
| 1-5 | $O_3$ | 15 | 7 | 5 | 7 | 600 | 100 | 68.14 | 0.6813 |
| 1-6 | $O_3$ | 5 | 7 | 5 | 7 | 700 | 100 | 367.8 | 3.678 |
| 1-7 | $O_3$ | 7 | 7 | 5 | 7 | 700 | 100 | 665.9 | 6.659 |

As the injection time of the precursor at a process temperature of 600° C. was increased from 5 seconds to 15 seconds, the increase in deposition rate from 0.367 Å/cycle to 0.681 Å/cycle was observed, and after 7.5 seconds, a self-limited reaction was confirmed.

The increase in deposition rate (3.678 to 6.659 Å/cycle) according to the increase in injection time of the precursor (5 to 7 seconds) was also observed when the process temperature was increased to 700° C.

In addition, when the process temperature was increased from 600° C. to 700° C., the deposition rate was greatly increased (about 10-fold increased from 0.367 to 3.678 Å/cycle) at the same injection time of the precursor (5 seconds) and a high process temperature.

FIG. 1 shows a deposition rate according to an injection time of the precursor at a process temperature of 600° C. (Manufacturing Examples 1-1 to 1-5).

The novel silicon precursor compound of Example 1 showed excellent deposition results even at a high process temperature of 600° C. or more, confirming that the thickness and physical properties of the deposited thin film are very easily controlled.

Manufacturing Examples 2 and 3

Silicon oxide thin films were manufactured using a precursor (source gas), a precursor injection time, a precursor purge time, a reactive gas injection time, a reactive gas purge time and a cycle condition, which were maintained to be the same as those of Manufacturing Example 1 and a mixture of $H_2$ and $O_2$ ($H_2+O_2$) as a reactive gas at process temperatures of 600° C. (Manufacturing Examples 2-1 to 2-5) and 650° C. (Manufacturing Examples 3-1 to 3-5).

Oxygen ($O_2$) and hydrogen ($H_2$) were supplied into a reaction chamber at amounts of 1000 sccm and 320 sccm, respectively.

Table 3 shows process conditions and results (600° C.) using the precursor compound of Example 1 and a reactive gas ($H_2+O_2$).

TABLE 3

| Manufacturing Example | Reactive gas | Precursor injection time (sec) | Precursor purge time (sec) | Reactive gas injection time (sec) | Reactive gas purge time (sec) | Process temperature (° C.) | Cycle | Thickness (A) | Deposition rate (A/cycle) |
|---|---|---|---|---|---|---|---|---|---|
| 2-1 | $H_2 + O_2$ | 5 | 7 | 5 | 7 | 600 | 100 | 65.1 | 0.651 |
| 2-2 | $H_2 + O_2$ | 7.5 | 7 | 5 | 7 | 600 | 100 | 84.58 | 0.845 |
| 2-3 | $H_2 + O_2$ | 10 | 7 | 5 | 7 | 600 | 100 | 83.5 | 0.835 |
| 2-4 | $H_2 + O_2$ | 12.5 | 7 | 5 | 7 | 600 | 100 | 90.6 | 0.906 |
| 2-5 | $H_2 + O_2$ | 15 | 7 | 5 | 7 | 600 | 100 | 88.8 | 0.888 |

Figure 2:
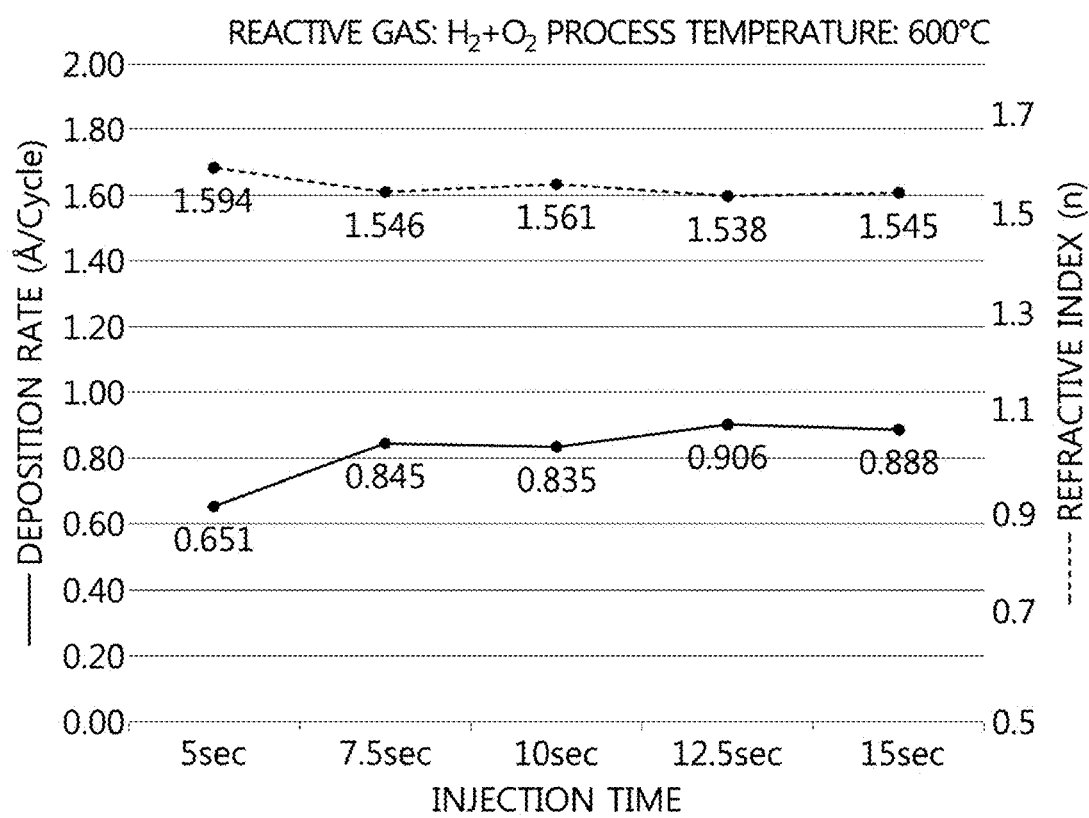
FIG. 2 is a graph of a deposition rate according to the injection time of a precursor and a refractive index of a formed thin film when deposition was performed using a precursor of Example 1 and a mixture of hydrogen ($H_2$) and oxygen ($O_2$) ($H_2+O_2$) as a reactant (reactive gas) at a process temperature of 600° C. (Manufacturing Examples 2-1 to 2-5).

FIG. 2 shows the deposition results obtained when a process temperature was 600° C., in which, as an injection time of the precursor was increased from 5 seconds to 15 seconds, the deposition rate was increased from 0.65 to 0.89 Å/cycle, and a self-limited reaction was confirmed at 7.5 seconds. The refractive index (R.I.) of the formed thin film was decreased from 1.594 to 1.545.

Compared with $O_3$ used as a reactive gas, when the mixture of oxygen ($O_2$) and hydrogen ($H_2$) was used, it can be confirmed that the deposition rate was increased under the same reaction conditions.

Table 4 shows process conditions and results (650° C.) using the precursor compound and reactive gas ($H_2+O_2$) of Example 1.

TABLE 4

| Manufacturing Example | Reactive gas | Precursor injection time (sec) | Precursor purge time (sec) | Reactive gas injection time (sec) | Reactive gas purge time (sec) | Process temperature (° C.) | Cycle | Thickness (Å) | Deposition rate (Å/cycle) |
|---|---|---|---|---|---|---|---|---|---|
| 3-1 | $H_2 + O_2$ | 5 | 7 | 5 | 7 | 650 | 100 | 122.2 | 0.367 |
| 3-2 | $H_2 + O_2$ | 7.5 | 7 | 5 | 7 | 650 | 100 | 134.9 | 0.465 |
| 3-3 | $H_2 + O_2$ | 10 | 7 | 5 | 7 | 650 | 100 | 147.5 | 0.580 |
| 3-4 | $H_2 + O_2$ | 12.5 | 7 | 5 | 7 | 650 | 100 | 161.1 | 0.588 |
| 3-5 | $H_2 + O_2$ | 15 | 7 | 5 | 7 | 650 | 100 | 159.2 | 0.681 |

Figure 3:
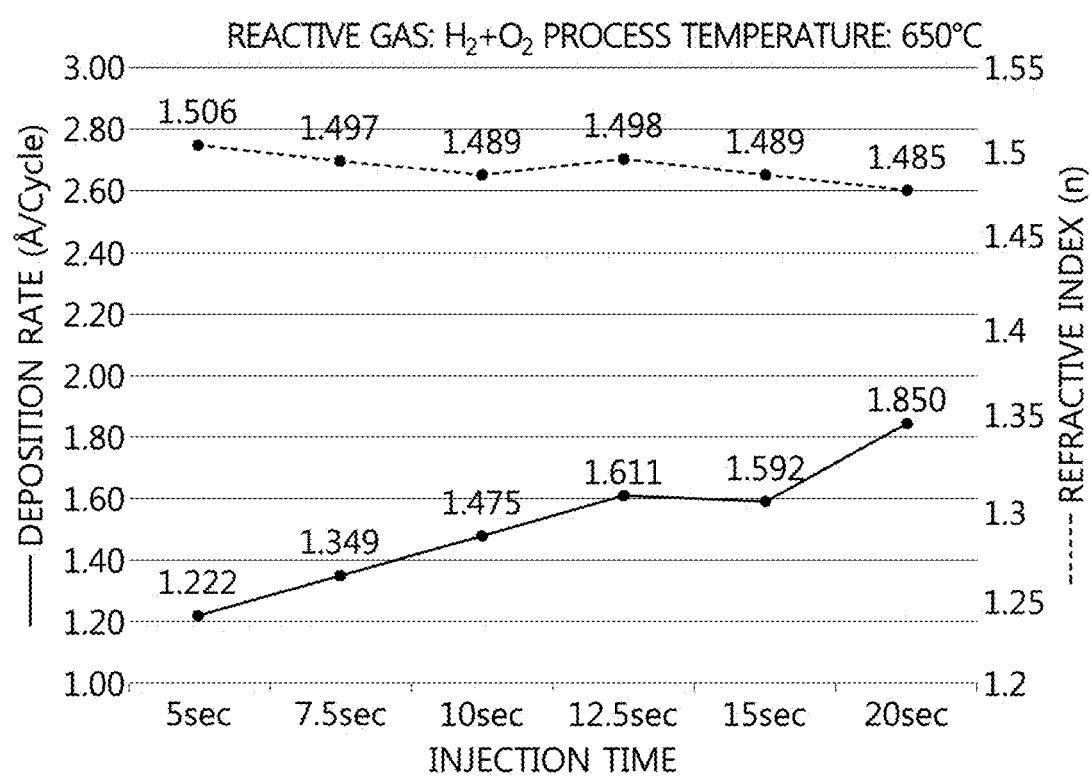
FIG. 3 is a graph of a deposition rate according to the injection time of a precursor and a refractive index of a formed thin film when deposition was performed using a precursor of Example 1 and a mixture of $H_2$ and $O_2$ ($H_2+O_2$) as a reactant (reactive gas) at a process temperature of 650° C. (Manufacturing Examples 3-1 to 3-5).

FIG. 3 shows the deposition results when a process temperature was 650° C., in which, as an injection time of the precursor was increased from 5 seconds to 20 seconds, the deposition rate increased from 1.22 to 1.85 Å/cycle, and a self-limited reaction was confirmed after 10 seconds. The refractive index (R.I.) of the produced thin film was decreased from 1.506 to 1.485.

Manufacturing Example 4

A silicon oxide film was manufactured using an ALD apparatus and $CH_3SiCl_3$ as a precursor. A substrate used in this experiment was a bare Si wafer, before deposition, the bare Si wafer was subjected to 10-minute ultrasonication in acetone-ethanol-deionized water (DI water), and then immersed in a 10% HF solution ($HF:H_2O=1:9$) for 10 seconds to remove a natural oxide film thereon.

Figure 6:
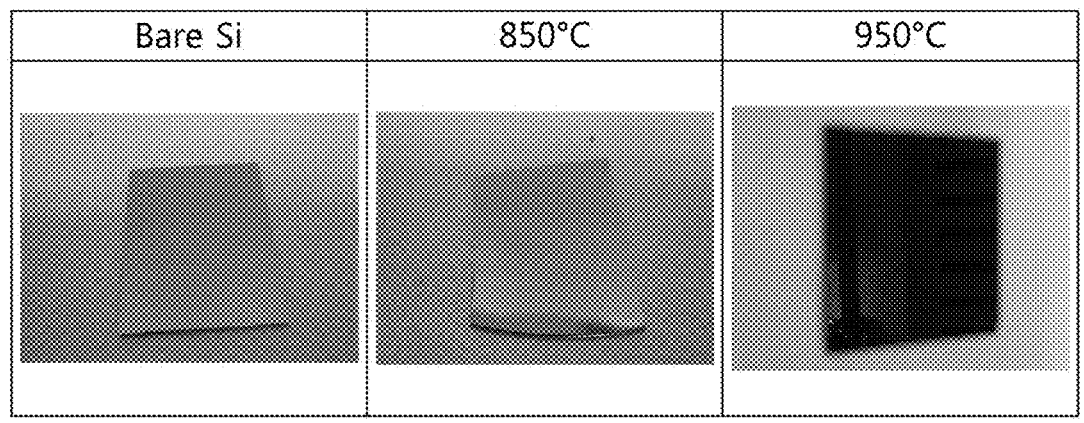
FIG. 6 is a set of images showing deposited states after an oxide film is deposited on a silicon wafer using a $CH_3SiCl_3$ precursor at process temperatures of 850° C. and 950° C., respectively (Experimental Example 2).

As shown in FIG. 6 representing the experimental result for thermal decomposition according to a process temperature, it was confirmed that the precursor $CH_3SiCl_3$ did not undergo thermal decomposition at a high temperature of 850° C., and excellent thermal stability was ensured.

[Injection of $CH_3SiCl_3$ precursor](X sec)-[Purging of precursor (argon, Ar)](10 sec)-[Reactive gas (ozone, $O_3$)](5 sec)-[Purging with reactive gas (Ar)](10 sec) were sequentially performed for deposition, and the above-described processes were set as one cycle.

In the supply of the precursor, the precursor injection time (X) was 1 to 12 seconds, the precursor delivery gas, argon, was injected at 50 sccm, and deposition was performed at a process temperature of 600° C.

In the reaction gas, the mixture of $H_2$ and $O_2$, $H_2$ and $O_2$ were injected at 325 sccm and 1000 sccm, respectively.

Table 5 below shows process conditions and deposition results (thickness and deposition rate) of Manufacturing Example 4, and specifically, process conditions and deposition results (600° C.) using the $CH_3SiCl_3$ precursor compound and the reactive gas ($H_2+O_2$).

TABLE 5

| Manufacturing Example | Precursor injection time (sec) | Precursor purge time (sec) | Reactive gas injection time (sec) | Reactive gas purge time (sec) | Process temperature (° C.) | Cycle | Thickness (Å) | Deposition rate (Å/cycle) |
|---|---|---|---|---|---|---|---|---|
| 4-1 | 1 | 10 | 5 | 10 | 600 | 100 | 30.8 | 0.31 |
| 4-2 | 3 | 10 | 5 | 10 | 600 | 100 | 32.1 | 0.32 |
| 4-3 | 6 | 10 | 5 | 10 | 600 | 100 | 31.0 | 0.30 |
| 4-4 | 12 | 10 | 5 | 10 | 600 | 100 | 31.6 | 0.31 |

Manufacturing Example 5

Deposition was performed under the same process conditions, except that the process temperature was changed to 700° C. in Manufacturing Example 4.

Table 6 below shows process conditions and deposition results (thickness and deposition rate) of Manufacturing Example 5, and specifically, process conditions and deposition results (700° C.) using the $CH_3SiCl_3$ precursor compound and the reactive gas ($H_2+O_2$).

TABLE 6

| Manufacturing Example | Precursor injection time (sec) | Precursor purge time (sec) | Reactive gas injection time (sec) | Reactive gas purge time (sec) | Process temperature (° C.) | Cycle | Thickness (Å) | Deposition rate (Å/cycle) |
|---|---|---|---|---|---|---|---|---|
| 5-1 | 1 | 10 | 5 | 10 | 700 | 100 | 48.2 | 0.48 |
| 5-2 | 3 | 10 | 5 | 10 | 700 | 100 | 56.4 | 0.56 |
| 5-3 | 6 | 10 | 5 | 10 | 700 | 100 | 56.2 | 0.56 |
| 5-4 | 12 | 10 | 5 | 10 | 700 | 100 | 56.4 | 0.56 |

Manufacturing Example 6

Deposition was performed under the same process conditions, except that the process temperature was changed to 750° C. in Manufacturing Example 4.

Table 7 below shows process conditions and deposition results (thickness and deposition rate) of Manufacturing Example 6, and specifically, process conditions and deposition results (750° C.) using the $CH_3SiCl_3$ precursor compound and the reactive gas ($H_2+O_2$).

TABLE 7

| Manufacturing Example | Precursor injection time (sec) | Precursor purge time (sec) | Reactive gas injection time (sec) | Reactive gas purge time (sec) | Process temperature (° C.) | Cycle | Thickness (A) | Deposition rate (A/cycle) |
|---|---|---|---|---|---|---|---|---|
| 6-1 | 1 | 10 | 5 | 10 | 750 | 100 | 72.1 | 0.72 |
| 6-2 | 3 | 10 | 5 | 10 | 750 | 100 | 75.4 | 0.75 |
| 6-3 | 6 | 10 | 5 | 10 | 750 | 100 | 75.5 | 0.75 |
| 6-4 | 12 | 10 | 5 | 10 | 750 | 100 | 76.2 | 0.76 |

Manufacturing Example 7

Deposition was performed under the same process conditions, except that the process temperature was changed to 800° C. in Manufacturing Example 4.

Table 8 below shows process conditions and deposition results (thickness and deposition rate) of Manufacturing Example 7, and specifically, process conditions and deposition results (800° C.) using the $CH_3SiCl_3$ precursor compound and the reactive gas ($H_2+O_2$).

TABLE 8

| Manufacturing Example | Precursor injection time (sec) | Precursor purge time (sec) | Reactive gas injection time (sec) | Reactive gas purge time (sec) | Process temperature (° C.) | Cycle | Thickness (A) | Deposition rate (A/cycle) |
|---|---|---|---|---|---|---|---|---|
| 8-1 | 1 | 10 | 5 | 10 | 800 | 100 | 93.4 | 0.93 |
| 8-2 | 3 | 10 | 5 | 10 | 800 | 100 | 97.2 | 0.97 |
| 8-3 | 6 | 10 | 5 | 10 | 800 | 100 | 99.4 | 0.99 |
| 8-4 | 12 | 10 | 5 | 10 | 800 | 100 | 119.2 | 1.19 |

Figure 4:
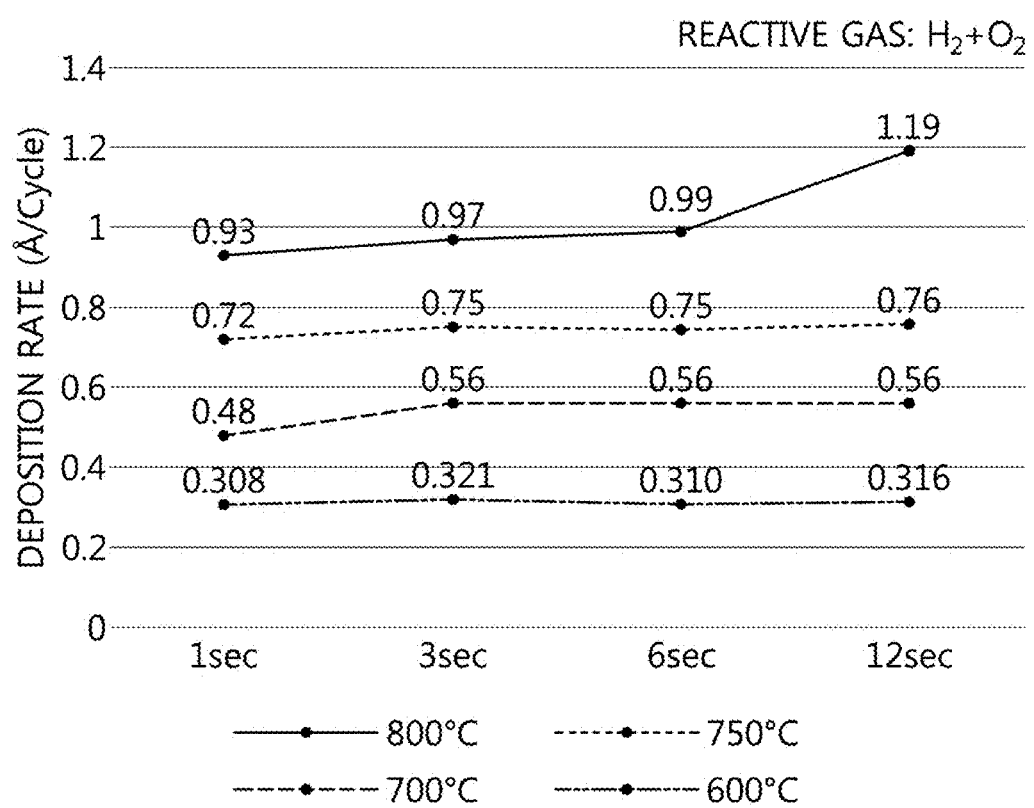
FIG. 4 is a graph of a deposition rate (Å/cycle) according to the injection time of a precursor when deposition was performed using a $CH_3SiCl_3$ precursor and a mixture of $H_2$ and $O_2$ ($H_2+O_2$) as a reactant (reactive gas) at a process temperature of 600° C., 700° C., 750° C. or 800° C. (Manufacturing Examples 4 to 7).

As shown in FIG. 4, as the injection time of the precursor of Manufacturing Example 4 deposited at the lowest process temperature of 600° C. among the examples was changed from 1 second to 12 seconds, the deposition rate was changed from 0.30 to 0.32 Å/cycle, but there was no significant change according to the injection time of the precursor.

As the process temperature was increased, the deposition rate at the process temperature of 700° C. (Manufacturing Example 5) tended to be increased from 0.48 to 0.56 Å/cycle, the deposition rate at the process temperature of 750° C. (Manufacturing Example 6) tended to be increased from 0.72 to 0.76 Å/cycle, and the deposition rate at the process temperature of 800° C. (Manufacturing Example 7) tended to be increased from 0.93 to 1.19 Å/cycle.

Under each process temperature condition, although there was no significant change according to injection time of the precursor, the deposition rate tended to slightly increase as the injection time of the precursor increased.

In addition, it was confirmed that self-saturation started from the precursor injection time of 3 seconds at a process temperature of 600 to 750° C. From 800° C., a behavior similar to CVD was observed, but the actual CVD reaction was not confirmed.

Therefore, the precursors of Manufacturing Examples showed excellent deposition results at high process temperatures of 600° C. or more and a relatively low deposition rate behavior, confirming that the thickness and physical properties of the deposited thin film were very easily controlled.

[Experimental Examples 1 and 2] The thermal stability of the silicon oxide ($SiO_2$) film manufactured by depositing each of the precursor of Example 1 and the $CH_3SiCl_3$ precursor was evaluated.

[Experimental Example 1] Evaluation of Thermal Stability of Silicon Oxide ($SiO_2$) Film Manufactured Using Precursor of Example 1

To evaluate the decomposition characteristic of the silicon precursor compound of Example 1 and the thermal stability of the oxide film manufactured using the precursor compound, a silicon oxide film was deposited on a bare Si wafer under the same reaction conditions as in Manufacturing Example 1 (compositions of precursor and reactant, a precursor injection time, a precursor purge time, a reactant injection time, a reactant purge time and a cycle) by changing a process temperature to 650° C., 700° C. or 800° C., and then a deposited state was confirmed. The result is shown in FIG. 5.

Figure 5:
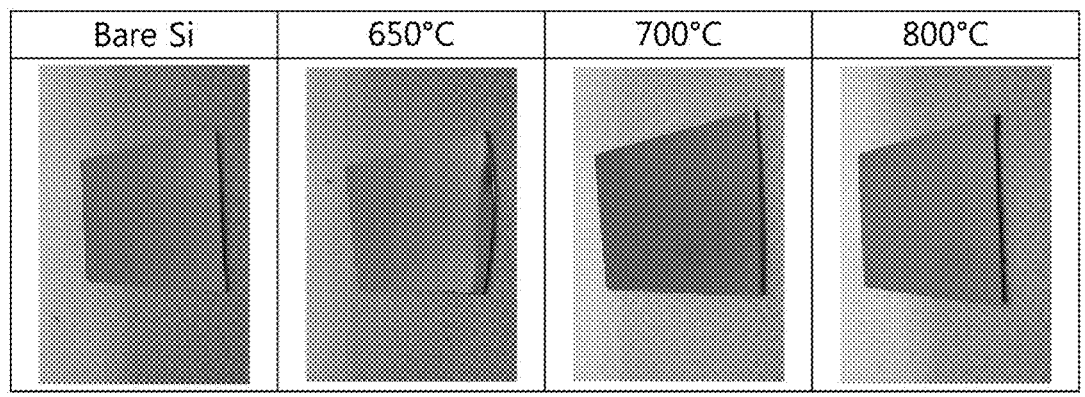
FIG. 5 is a set of images showing deposited states after an oxide film is deposited on a silicon wafer using a precursor of Example 1 at process temperatures of 650° C., 700° C. and 800° C., respectively (Experimental Example 1).

Referring to FIG. 5, the formation of the thin film through the deposition of the silicon precursor compound of Example 1 at a high temperature of 650° C. or more was observed, thus confirming that the silicon precursor compound of Example 1 and the silicon oxide film manufactured by depositing the same ensured excellent thermal stability at a high temperature.

[Experimental Example 2] Evaluation of Thermal Stability of Silicon Oxide ($SiO_2$) Film Manufactured Using $CH_3SiCl_3$ Precursor To evaluate the decomposition characteristic of the $CH_3SiCl_3$ silicon precursor compound and the thermal stability of the oxide film manufactured using the precursor compound, a silicon oxide film was deposited on a bare Si wafer under the same reaction conditions as in Manufacturing Example 1 (compositions of precursor and reactant, a precursor injection time, a precursor purge time, a reactant injection time, a reactant purge time and a cycle) by changing a process temperature to 850° C. or 900° C., and then a deposited state was confirmed. The result is shown in FIG. 6.

Referring to FIG. 6, the formation of the thin film through the deposition of the $CH_3SiCl_3$ silicon precursor compound at a high temperature of 850° C. or more was observed, thus confirming that the $CH_3SiCl_3$ silicon precursor compound and the silicon oxide film manufactured by depositing the same ensured excellent thermal stability at a high temperature.

[Experimental Examples 3 and 4] The composition of the silicon oxide ($SiO_2$) film manufactured by depositing each of the precursor of Example 1 and the $CH_3SiCl_3$ precursor was evaluated using X-ray photoelectron spectroscopy (XPS) and Fourier-transform infrared spectroscopy (FT-IR).

[Experimental Example 3] Evaluation of Composition of Silicon Oxide ($SiO_2$) Film Manufactured Using Precursor of Example 1

Figure 7:
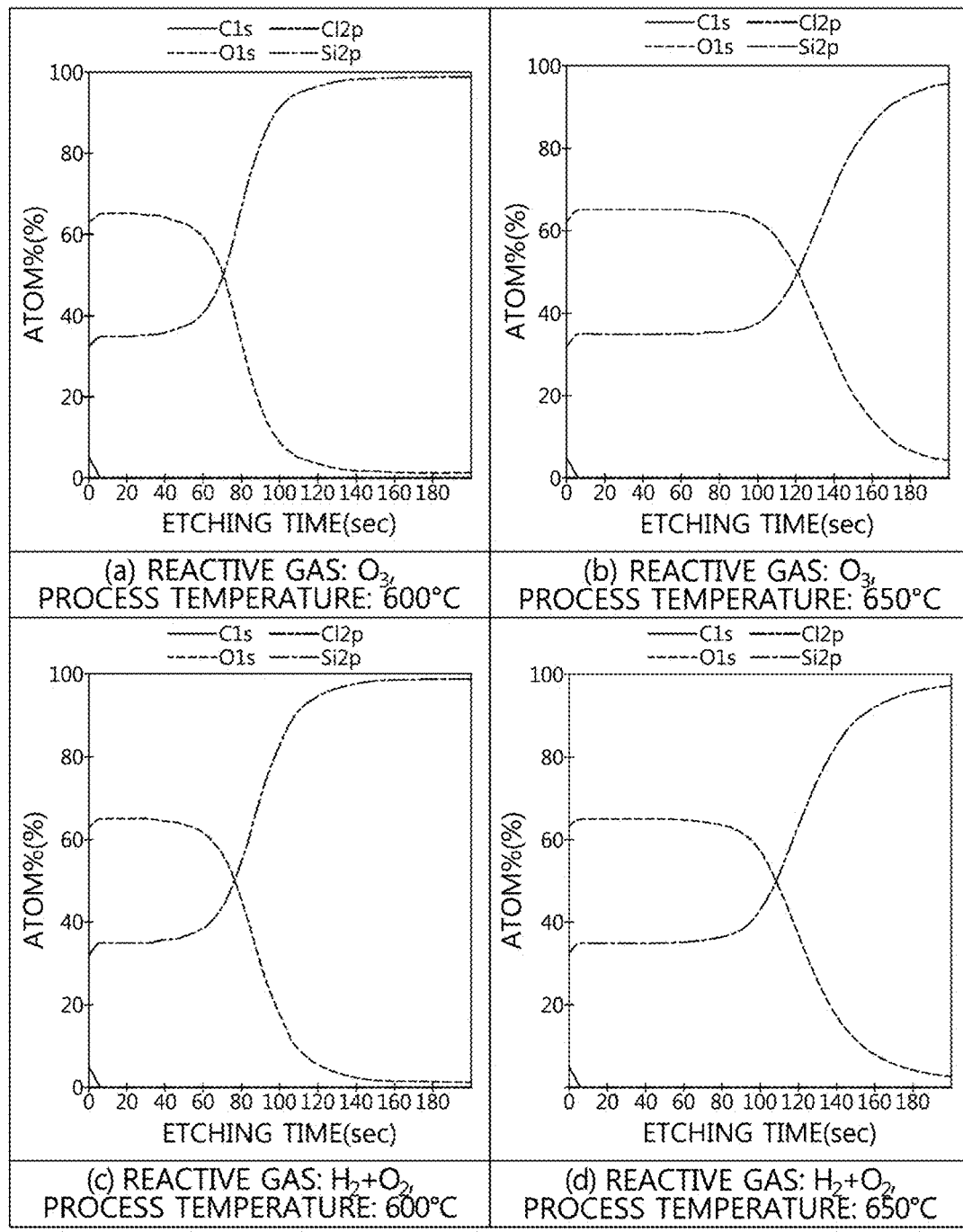
FIG. 7 is a set of graphs showing the compositions of four types of silicon oxide films manufactured by depositing a precursor of Example 1 and a reactive gas ($O_3$) at process temperatures of 600° C. and 650° C., respectively, and depositing a precursor of Example 1 and a reactive gas (mixture of $H_2$ and $O_2$ ($H_2+O_2$)) at process temperatures of 600° C. and 650° C., respectively, measured by X-ray photoelectron spectroscopy (XPS) (Experimental Example 3).
Figure 9:
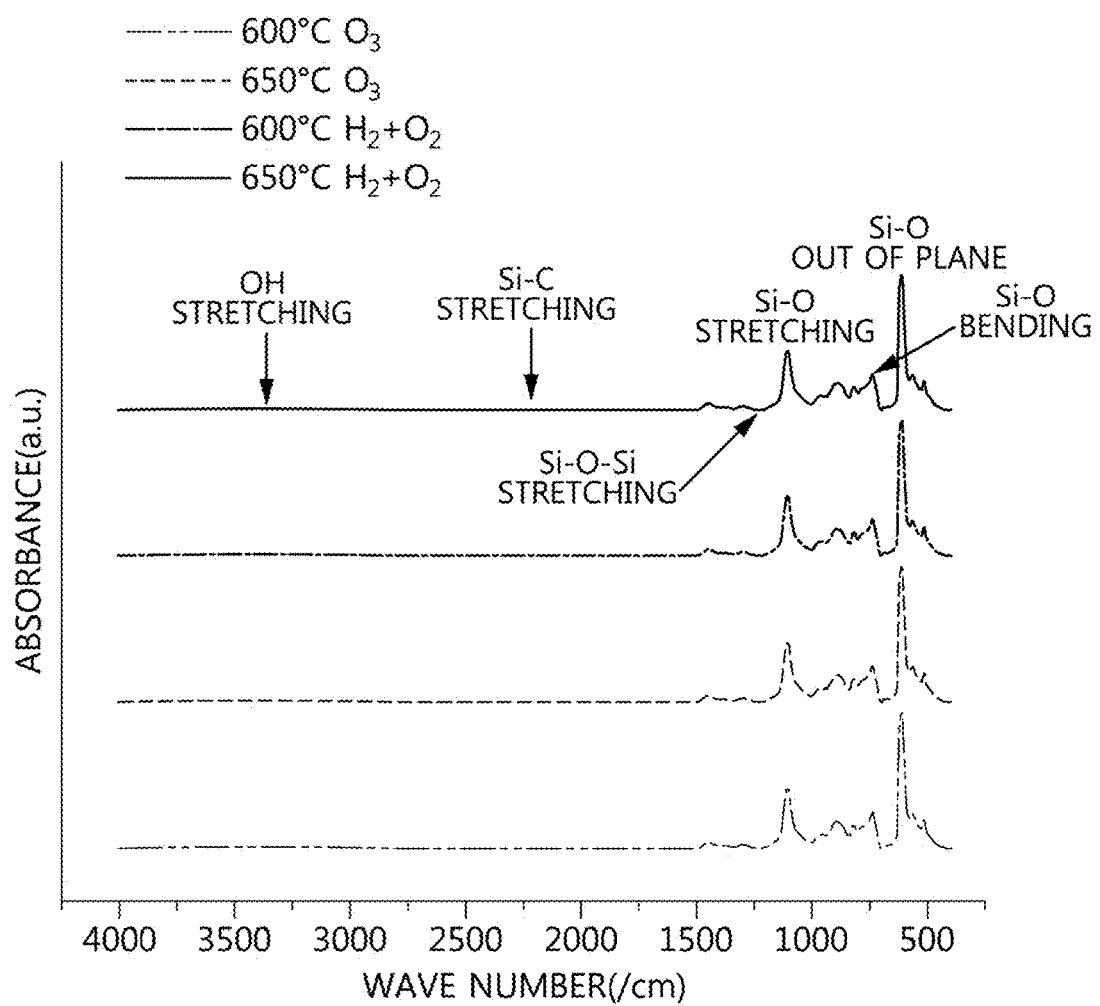
FIG. 9 is a graph showing the compositions of four types of silicon oxide films manufactured by depositing a precursor of Example 1 and a reactive gas ($O_3$) at process temperatures of 600° C. and 650° C., respectively, and depositing a precursor of Example 1 and a reactive gas (mixture of $H_2$ and $O_2$ ($H_2+O_2$)) at process temperatures of 600° C. and 650° C., respectively, measured by Fourier-transform infrared spectroscopy (FT-IR) (Experimental Example 3).

The compositions of the four types of silicon oxide films (Manufacturing Examples 1 to 3) manufactured by depositing the precursor of Example 1 and a reactive gas ($O_3$) at process temperatures of 600° C. and 650° C. and depositing the precursor of Example 1 and a mixture of oxygen and hydrogen ($H_2+O_2$) at process temperatures of 600° C. and 650° C. were analyzed through XPS and FT-IR, and the results are shown in FIGS. 7 and 9.

FIG. 7 shows the XPS results for the silicon oxide film deposited using $O_3$ as a reactive gas at a process temperatures of 600° C. (FIG. 7A) and 650° C. (FIG. 7B) and XPS results for the silicon oxide film deposited using the mixture of oxygen and hydrogen ($H_2+O_2$) at process temperatures of 600° C. (FIG. 7C) and 650° C. (FIG. 7D).

According to the XPS results for all thin films manufactured using the reactive gases ($O_3$ and $H_2+O_2$) and process temperatures of 600 and 650° C., it was confirmed that impurities such as carbon (C), chlorine (Cl), nitrogen (N) and hydrogen (H) were not detected, and thus high-quality silicon oxide thin films without impurities were formed.

As shown in FIG. 9, according to the FT-IR result for the silicon oxide thin films, the same result in that no impurity binding peak was shown was obtained with the reactants ($O_3$, $H_2+O_2$) at the process temperatures of 600 and 650° C. was confirmed.

Figure 8:
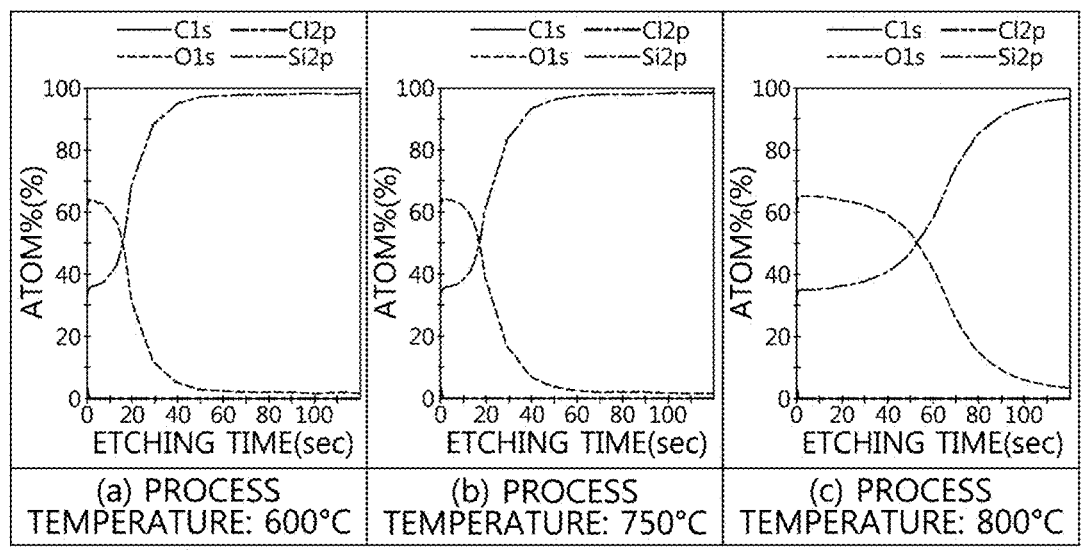
FIG. 8 is a set of graphs showing silicon oxide films deposited using a $CH_3SiCl_3$ precursor and a mixture of $H_2$ and $O_2$ ($H_2+O_2$) as a reactive gas at process temperatures of 600° C., 750° C. and 800° C., respectively, measured by XPS (Experimental Example 4).
Figure 10:
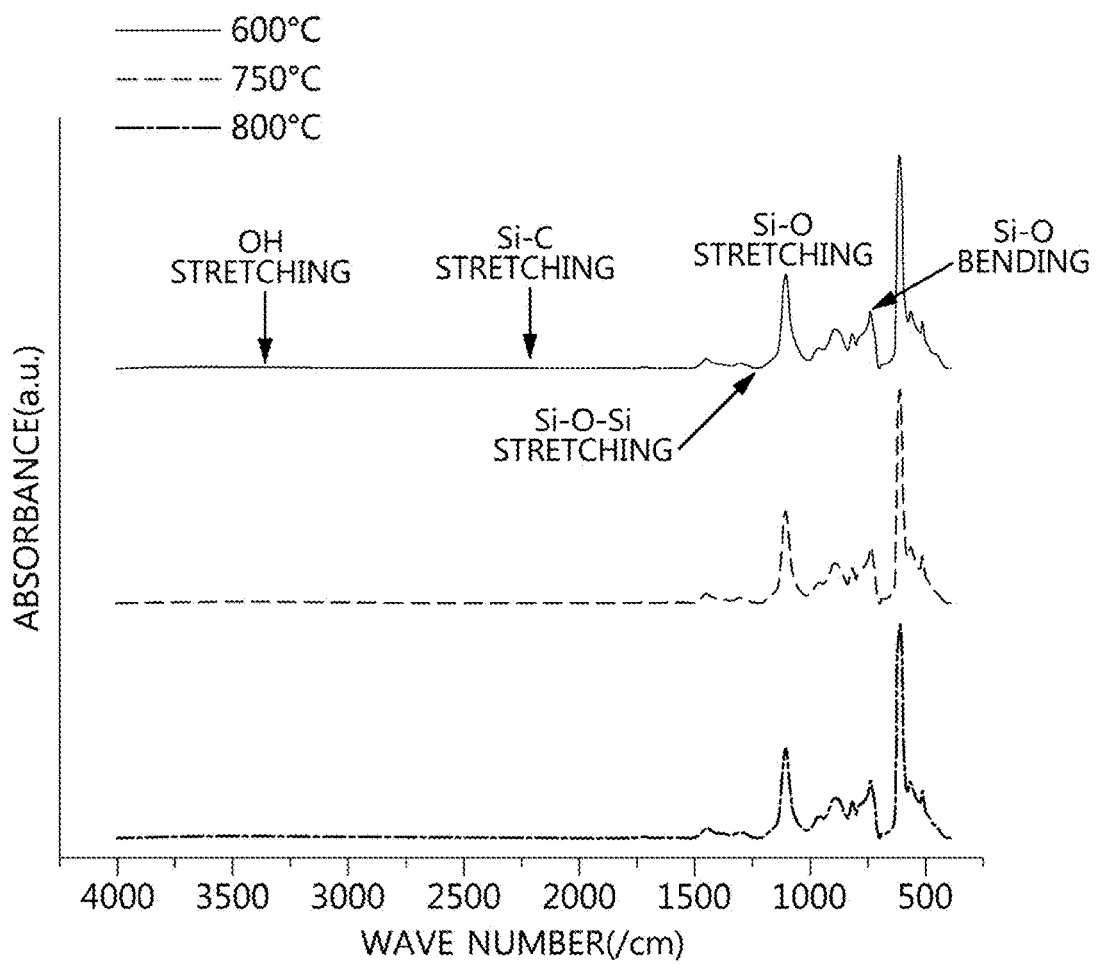
FIG. 10 is a graph showing the FT-IR result of a silicon oxide film deposited using a CH₃SiCl₃ precursor and a mixture of H₂ and O₂ (H₂+O₂) as a reactive gas at a process temperature of 600° C., 750° C. or 800° C. (Experimental Example 4).

[Experimental Example 4] Analysis of Composition of Silicon Oxide ($SiO_2$) Film Manufactured Using $CH_3SiCl_3$ Precursor The compositions of three types of the silicon oxide films (Manufacturing Examples 4, 6 and 7) manufactured by depositing the $CH_3SiCl_3$ precursor and the reactive gas (mixture of oxygen and hydrogen ($H_2+O_2$)) at process temperatures of 600° C., 750° C. and 800° C. were analyzed through XPS and FT-IR, respectively, and the results are shown in FIGS. 8 and 10.

FIG. 8 is a set of XPS graphs under process temperature conditions, in which FIG. 8A is an XPS graph for the silicon oxide film deposited at a process temperature of 600° C., FIG. 8B is an XPS graph for the silicon oxide film deposited at a process temperature of 750° C., and FIG. 8C is an XPS graph for the silicon oxide film deposited at a process temperature of 800° C.

As shown in FIG. 8, since no impurity such as carbon (C), chlorine (Cl), nitrogen (N) or hydrogen (H) was observed in the deposited silicon oxide film, it was confirmed that a high-quality silicon oxide thin film without impurities was formed.

FIG. 10 is an FT-IR graph for the silicon oxide films manufactured at different process temperatures as described above, and the same result as shown in the above-described XPS result, in which no impurity binding peak was shown, was obtained from all of the silicon oxide films through FT-IR.

[Experimental Examples 5 and 6] The surface characteristic of the silicon oxide film ($SiO_2$) manufactured by depositing each of the precursor of Example 1 and the $CH_3SiCl_3$ precursor was evaluated by atomic force microscopy (AFM).

[Experimental Example 5] Surface Characteristic of Silicon Oxide ($SiO_2$) Film Manufactured Using Precursor of Example 1

Four types of the silicon oxide films (Manufacturing Examples 1 to 3) manufactured by depositing the precursor of Example 1 and $O_3$ as a reactive gas at process temperatures of 600° C. and 650° C. and depositing the precursor of Example 1 and the mixture of oxygen and hydrogen ($H_2+O_2$) at process temperatures of 600° C. and 650° C. were observed through AFM, and thereby the surface roughness (Ra) of each silicon oxide film was measured. The result is shown in FIG. 11.

Figure 11:
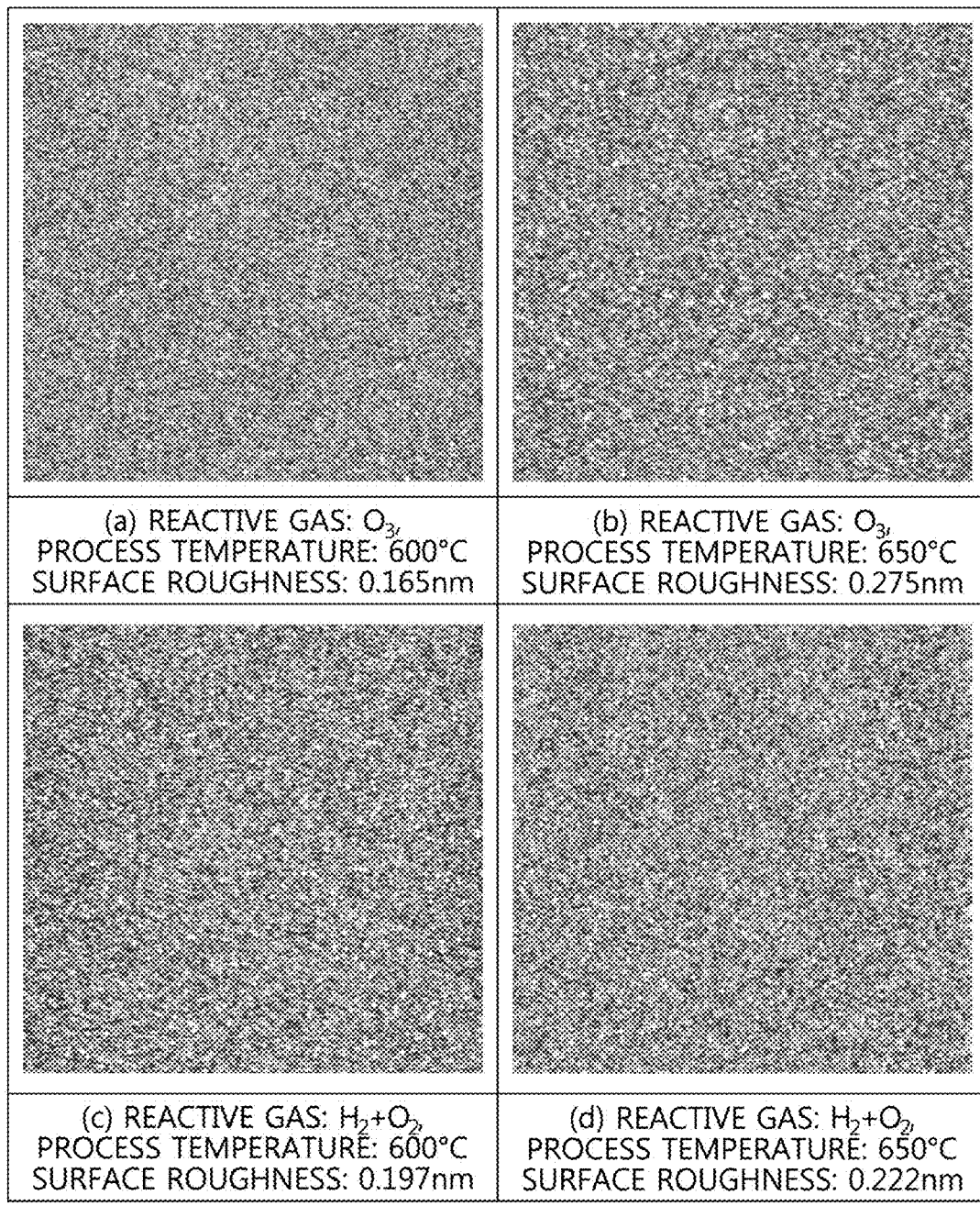
FIG. 11 shows atomic force microscopy (AFM) images of four types of silicon oxide films manufactured by depositing a precursor of Example 1 and a reactive gas (O₃) at process temperatures of 600° C. and 650° C., respectively, and depositing a precursor of Example 1 and a reactive gas (mixture of H₂ and O₂ (H₂+O₂)) at process temperatures of 600° C. and 650° C., respectively, and surface roughnesses (Ra) analyzed thereby (Experimental Example 5).

As shown in FIG. 11, the surface roughness was measured in a range of 0.165 to 0.275 nm, confirming that all of the silicon oxide films exhibited an excellent roughness of 3 Å or less, and when the same reactive gas was used, the roughness increased as the process temperature increased (FIG. 11A (reactive gas: $O_3$, process temperature: 600° C., Ra: 0.165 nm), FIG. 11B (reactive gas: $O_3$, process temperature: 650° C., Ra: 0.275 nm), FIG. 11C (reactive gas: the mixture of $O_2$ and $H_2$, process temperature: 600° C., Ra: 0.197 nm), and FIG. 11D (reactive gas: the mixture of oxygen ($O_2$) and hydrogen ($H_2$), process temperature: 650° C., Ra: 0.222 nm).

Figure 12:
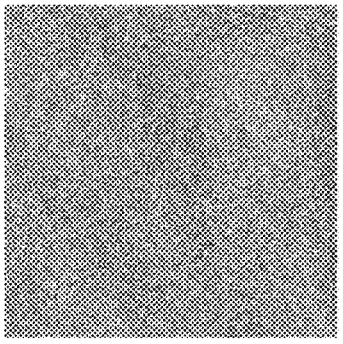
FIG. 12 shows AFM images of silicon oxide films deposited using a CH₃SiCl₃ precursor and a mixture of H₂ and O₂ (H₂+O₂) as a reactive gas at process temperatures of 600° C., 750° C. and 800° C., respectively, and surface roughnesses (Ra) analyzed thereby (Experimental Example 6).

[Experimental Example 6] Surface Characteristic of Silicon Oxide ($SiO_2$) Film Manufactured Using $CH_3SiCl_3$ Precursor FIG. 12 shows AFM images of three types of the silicon oxide films (Manufacturing Examples 4, 6 and 7) deposited using the $CH_3SiCl_3$ precursor and the reactive gas (mixture of oxygen and hydrogen ($H_2+O_2$)) at process temperatures of 600° C., 750° C. and 800° C., respectively, and surface roughnesses (Ra) analyzed thereby. FIG. 12A is an AFM image of the silicon oxide film deposited at a process temperature of 600° C., FIG. 12B is an AFM image of the silicon oxide film deposited at a process temperature of 750° C., and FIG. 12C is an AFM image of the silicon oxide film deposited at a process temperature of 800° C.

As shown in FIG. 12, the surface roughness was measured in a range of 0.117 to 0.197 nm, confirming that all of the manufactured silicon oxide films exhibited an excellent roughness of 2 Å or less. In addition, it can be confirmed that, as the process temperature increased, the roughness increased.

[Experimental Examples 7 and 8] The density characteristic of the silicon oxide ($SiO_2$) film manufactured by depositing each of the precursor of Example 1 and the CH₃SiCl₃ precursor was evaluated by X-ray reflectometry (XRR).

[Experimental Example 7] Density Characteristic of Silicon Oxide (SiO₂) Film Manufactured Using Precursor of Example 1

Figure 13:
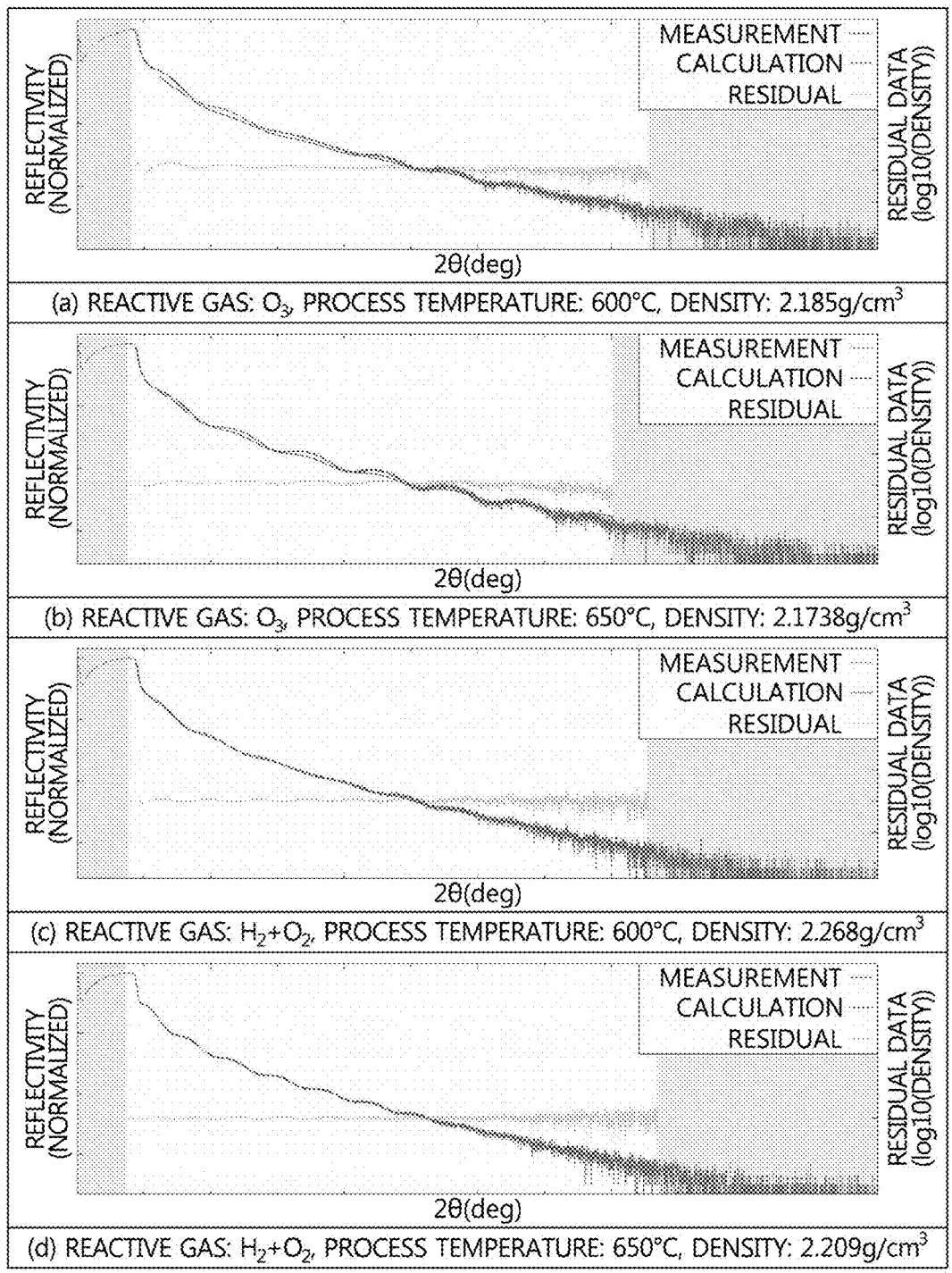
FIG. 13 shows X-ray reflectometry (XRR) results for four types of silicon oxide films manufactured by depositing a precursor of Example 1 and a reactive gas (O₃) at process temperatures of 600° C. and 650° C., respectively, and depositing a precursor of Example 1 and a reactive gas (mixture of H₂ and O₂ (H₂+O₂)) at process temperatures of 600° C. and 650° C., respectively, and densities measured thereby (Experimental Example 7).

From the XRR results for four types of the silicon oxide films (Manufacturing Examples 1 to 3) manufactured by depositing the precursor of Example 1 and a reactive gas (O₃) at process temperatures of 600° C. and 650° C., respectively, and depositing the precursor of Example 1 and a reactive gas (mixture of H₂ and O₂ (H₂+O₂)) at process temperatures of 600° C. and 650° C., respectively, densities of the silicon oxide films were evaluated, and the results are shown in FIG. 13.

As the measurement results shown in FIG. 13, when O₃ was used as a reactive gas and the process temperature was 600° C., the density was 2.185 g/cm³ (FIG. 13A), and when O₃ was used as a reactive gas and the process temperature was 650° C., the density was 2.1738 g/cm³ (FIG. 13B).

In addition, when the mixture of oxygen (O₂) and hydrogen (H₂) was used as a reactive gas, and the process temperature was 600° C., the density was 2.268 g/cm³ (FIG. 13C), and when the mixture of oxygen (O₂) and hydrogen (H₂) was used as a reactive gas, and the process temperature was 650° C., the density was 2.209 g/cm³ (FIG. 13D).

As measured, the densities of all of the manufactured thin films were similar to that of SiO₂ bulk (2.68 g/cm³), confirming that a thin film having excellent quality and excellent corrosion resistance was formed.

Figure 14:
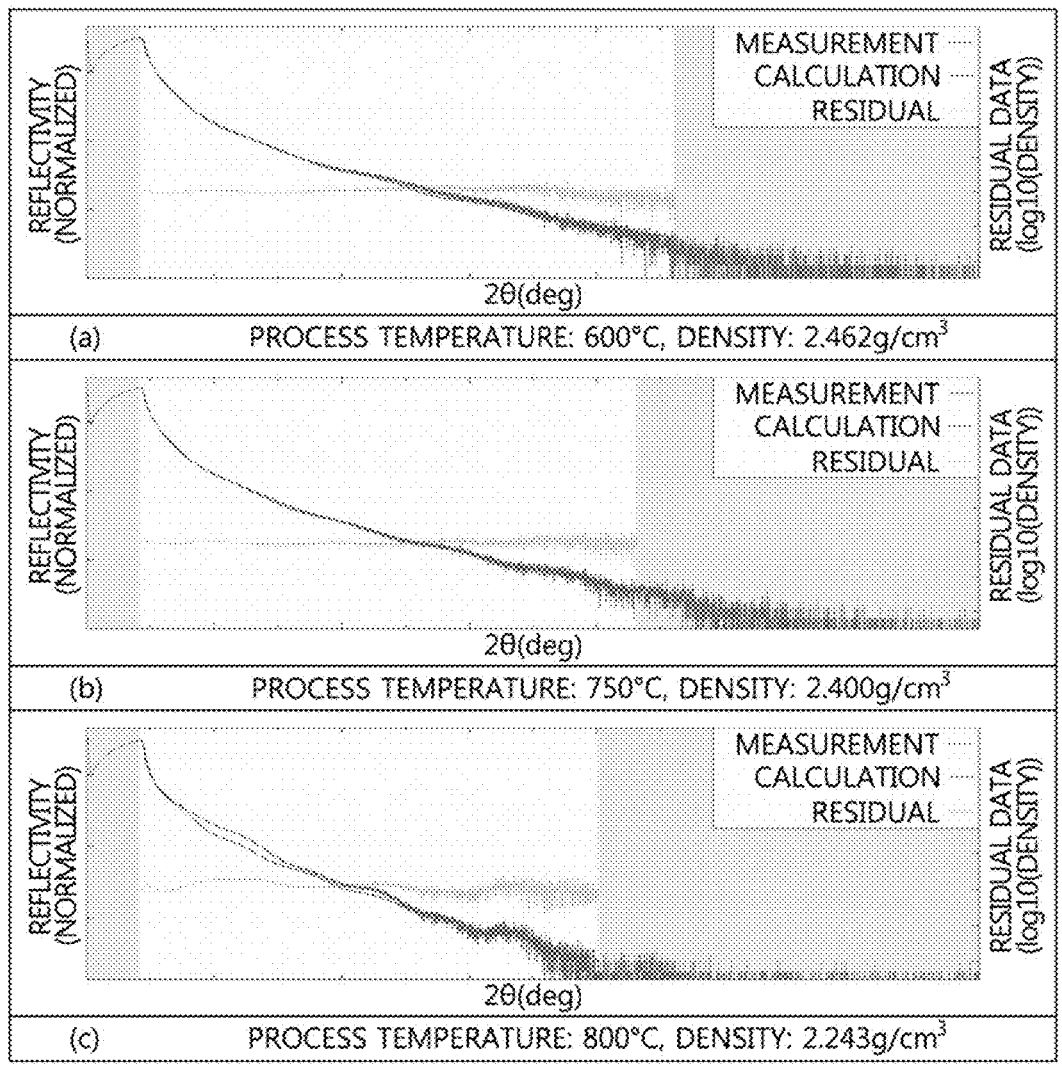
FIG. 14 shows XRR results for silicon oxide films deposited using a CH₃SiCl₃ precursor and the mixture of H₂ and O₂ (H₂+O₂) as a reactive gas at process temperatures of 600° C., 750° C., and 800° C., respectively, and densities measured thereby (Experimental Example 8).

[Experimental Example 8] Density Characteristic of Silicon Oxide (SiO₂) Film Manufactured Using CH₃SiCl₃ Precursor From the XRR results for three types of the silicon oxide films (Manufacturing Examples 4, 6 and 7) manufactured by depositing the CH₃SiCl₃ precursor and a reactive gas (mixture of H₂ and O₂ (H₂+O₂)) at process temperatures of 600° C., 750° C. and 800° C., respectively, densities of the silicon oxide films were evaluated, and the results are shown in FIG. 14. FIG. 14A is the XRR result of the silicon oxide film deposited at a process temperature of 600° C., FIG. 14B is the XRR result of the silicon oxide film deposited at a process temperature of 750° C., and FIG. 14C is the XRR result of the silicon oxide film deposited at a process temperature of 800° C.

As shown in FIG. 14, all of the silicon oxide films manufactured at different process temperatures had a density of 2.2 g/cm³ or more, and similar to the density of SiO₂ bulk (2.68 g/cm³), confirming that a high-quality thin film was formed. That is, since the silicon oxide film of the present invention has a density similar to that of SiO₂ bulk, excellent corrosion resistance can be expected.

[Experimental Example 9] Step Coverage Characteristic of Silicon Oxide (SiO₂) Film Manufactured Using Precursor of Example 1

Figure 15:
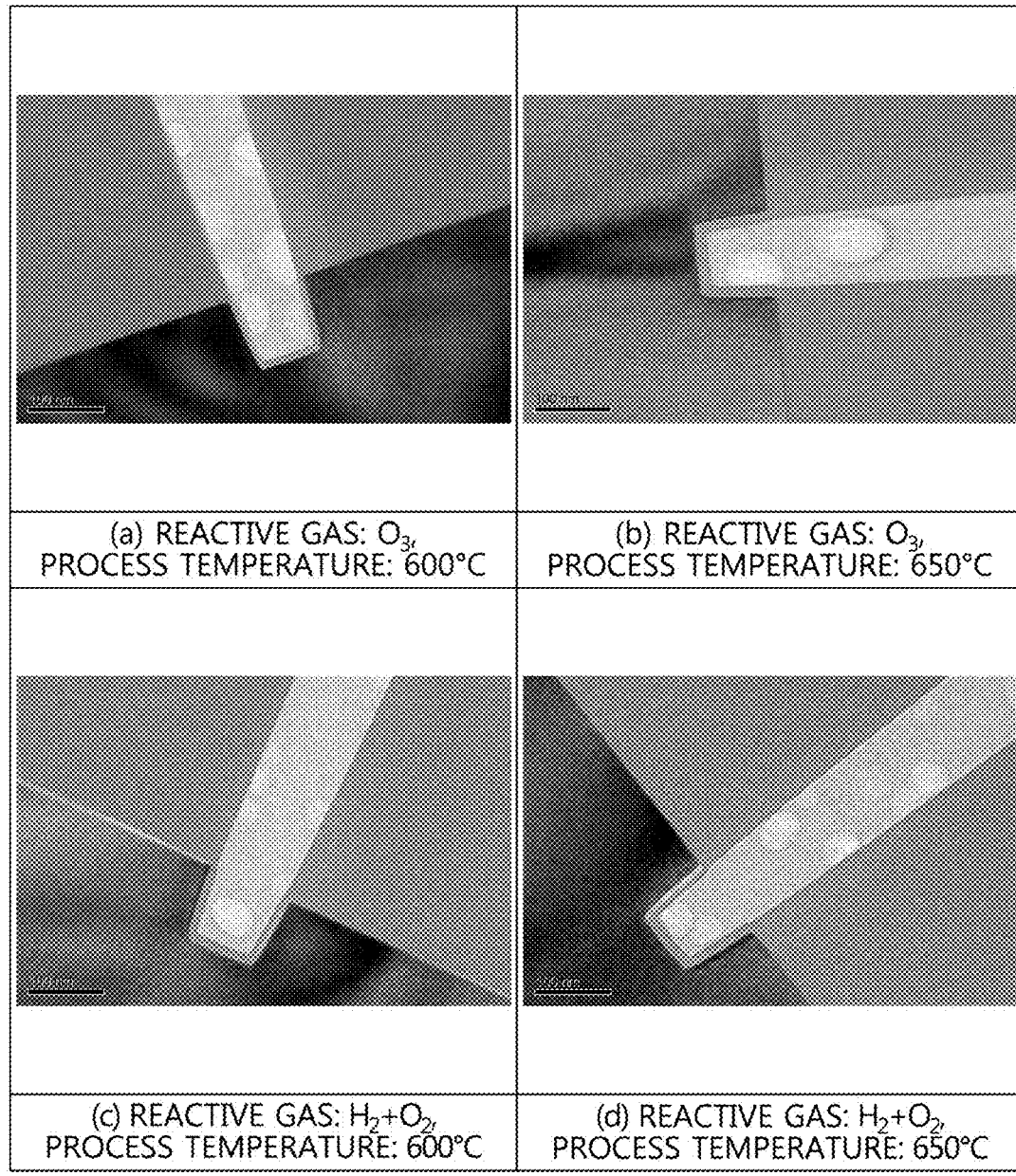
FIG. 15 is a set of transmission electron microscopy (TEM) images of four types of silicon oxide films manufactured by depositing a precursor of Example 1 and a reactive gas (O₃) at process temperatures of 600° C. and 650° C., respectively, and depositing a precursor of Example 1 and a reactive gas (mixture of H₂ and O₂ (H₂+O₂)) at process temperatures of 600° C. and 650° C., respectively (Experimental Example 9).

The step coverage characteristics of four types of the silicon oxide films (Manufacturing Examples 1 to 3) manufactured by depositing the precursor of Example 1 and a reactive gas (O₃) at process temperatures of 600° C. and 650° C. and depositing the precursor of Example 1 and a reactive gas (mixture of O₂ and H₂ (H₂+O₂)) at process temperatures of 600° C. and 650° C. were analyzed using a transmission electron microscope (TEM), and the results are shown in FIG. 15 (FIG. 15A (reactive gas: O₃, process temperature: 600° C.), FIG. 15B (reactive gas: O₃, process temperature: 650° C.), FIG. 15C (reactive gas: the mixture of oxygen and hydrogen (H₂+O₂), process temperature: 600° C.), and FIG. 15D (reactive gas: the mixture of oxygen and hydrogen (H₂+O₂), process temperature: 650° C.).

As shown in FIG. 15, it was observed that the silicon precursor compound of Example 1 uniformly formed a thin film on a fine substrate, confirming that an excellent step coverage characteristic was obtained.

As described above, it was confirmed that the novel silicon precursor of the present invention is able to be applied to high temperature ALD due to thermal stability at a high process temperature of 600° C. or more, accurately controlled in thickness by utilizing a low thin film growth behavior and a uniform deposition rate, and have an excellent step coverage characteristic and an excellent density characteristic. In addition, it was confirmed that an excellent silicon thin film is formed through deposition of the novel silicon precursor of the present invention.

Due to such excellent characteristics, the future application of a 3D-NAND memory device as a tunneling oxide film is expected, and the high-quality silicon thin film can be applied to various fields such as a nano device, the manufacture of a nano structure, a semiconductor, a display, and a solar cell. Moreover, in the manufacture of a non-memory semiconductor, the silicon thin film can be used as an insulating film.

The scope of the present invention is defined by the appended claims, rather than the detailed description, and it should be interpreted that all modifications and alterations derived from the meanings, scope and equivalents of the appended claims are included within the scope of the present invention.

The invention claimed is:

1. A method of manufacturing a thin film, comprising: introducing a vapor deposition precursor including any one or more compounds selected from the group consisting of a compound represented by Formula 1 below and a compound represented by Formula 2 below:

$$SiR^1_a(NR^2R^3)_{(4-a)} \quad \text{[Formula 1]}$$

In Formula 1,
a is an integer of 1 to 3,
R¹ is a linear or branched, substituted or unsubstituted C1 to C4 hydrocarbon or an isomer thereof, and
R² and R³ are each independently hydrogen, a linear or branched, substituted or unsubstituted C1 to C4 hydrocarbon, or an isomer thereof;

$$SiR^4_bR^5_c(X^1)_{(4-b-c)} \quad \text{[Formula 2]}$$

In Formula 2,
each of b and c is an integer of 0 to 3,
the sum of b and c is an integer of 1 to 3,
X¹ is a halogen group selected from the group consisting of Cl, Br, and I, and
R⁴ and R⁵ are each independently a linear or branched, substituted or unsubstituted C1 to C4 hydrocarbon, an unsubstituted C6 to C12 cyclic hydrocarbon, or an isomer thereof;
injecting a mixture of oxygen (O₂) and hydrogen (H₂) as a reactive gas; and
performing deposition at a process temperature of 600° C. or more.

2. The method according to claim 1, wherein $R^1$ is any one selected from the group consisting of a methyl group, an ethyl group, a n-propyl group, an iso-propyl group, a n-butyl group, an iso-butyl group, a sec-butyl group, a tert-butyl group and an isomer thereof, $R^2$ and $R^3$ are each independently any one selected from the group consisting of hydrogen, a methyl group, an ethyl group, a n-propyl group, an iso-propyl group, a n-butyl group, an iso-butyl group, a sec-butyl group, a tert-butyl group and an isomer thereof, and $R^4$ and $R^5$ are each independently any one selected from the group consisting of a methyl group, an ethyl group, a n-propyl group, an iso-propyl group, a n-butyl group, an iso-butyl group, a sec-butyl group, a tert-butyl group, an unsubstituted phenyl group, an unsubstituted benzyl group, an unsubstituted xylene group and an isomer thereof.

3. The method according to claim 1, wherein the vapor deposition precursor comprises any one or more selected from the group consisting of a compound of Formula 1 in which a is 1, and each of $R^1$, $R^2$ and $R^3$ is a methyl group, and compounds of Formulas 2-1 to 2-4 below.

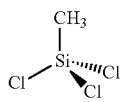

[Formula 2-1]

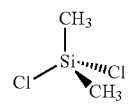

[Formula 2-2]

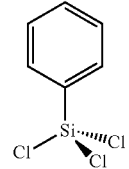

[Formula 2-3]

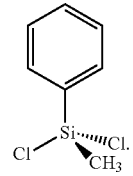

[Formula 2-4]

4. The method according to claim 1, which is performed by atomic layer deposition (ALD) or chemical vapor deposition (CVD).

* * * * *